United States Patent [19]
Scholz et al.

[11] Patent Number: 5,874,984
[45] Date of Patent: *Feb. 23, 1999

[54] OPTICAL CHARACTER GENERATOR FOR AN ELECTROGRAPHIC PRINTER

[75] Inventors: Christian Scholz, Stockdorf; Manfred Wiedemer, Ismaning, both of Germany

[73] Assignee: Océ Printing Systems GmbH, Pong, Germany

[*] Notice: This patent issued on a continued prosecution application filed under 37 CFR 1.53(d), and is subject to the twenty year patent term provisions of 35 U.S.C. 154(a)(2).

[21] Appl. No.: 495,592
[22] PCT Filed: Feb. 1, 1994
[86] PCT No.: PCT/DE94/00097
   § 371 Date: Aug. 2, 1995
   § 102(e) Date: Aug. 2, 1995
[87] PCT Pub. No.: WO94/18704
   PCT Pub. Date: Aug. 18, 1994

[30] Foreign Application Priority Data

Feb. 4, 1992 [DE] Germany .......................... 43 03 225.7

[51] Int. Cl.⁶ .............................. B41J 2/47; B41J 2/435; B41J 2/45
[52] U.S. Cl. ............................................. 347/238; 347/237
[58] Field of Search .................................. 347/237, 238; 257/79, 88, 98, 99

[56] References Cited

U.S. PATENT DOCUMENTS 4,956,684  9/1990  Urata ........................................ 257/98

FOREIGN PATENT DOCUMENTS

| 0086907 | 8/1983 | European Pat. Off. . |
| 0180479 | 5/1986 | European Pat. Off. . |
| 0199852 | 11/1986 | European Pat. Off. . |
| 0403476 | 12/1990 | European Pat. Off. . |
| 3704984 | 8/1988 | Germany . |
| 3726235 | 2/1989 | Germany . |

OTHER PUBLICATIONS

H. Tanabe et al., "High–Accuracy Die–Bonding Technology for LED Array", 8091 IEEE Transactions on Components, Hybrids and Manufacturing technology, Bd. CHMT–8 (1985 Dec.), No. 4, New York, USA, pp. 500–504.

Japanese Abstract, vol. 14, No. 282, (E–0942), JP2089379, Mar. 29, 1990.

Japanese Abstract, vol. 13, No. 287 (M–844) (3635), JP,A, 0180560, Mar. 27, 1989.

Japanese Abstract, vol. 11, No. 41 (E–478 (2488), JP,A, 61207086, Sep. 13, 1986.

*Primary Examiner*—N. Le
*Assistant Examiner*—Thinh Nguyen
*Attorney, Agent, or Firm*—Hill & Simpson

[57] ABSTRACT

An optical character generator for an electrographic printer has a plurality of monolithic circuits (11) which are arranged on a carrier (10) and have LEDs (12) which are integrated in the circuits and can be driven individually. The monolithic circuits (11) include a monolithically integrated photodiode drive combination, in the case of which both the associated LEDs (12) and the drive circuit (13), possibly including a BUS circuit (14) for the LEDs (12), are integrated in a monolithic circuit (11). The monolithic circuits are constructed using thin-film technology from III-V semiconductor material, preferably GaAs.

10 Claims, 7 Drawing Sheets

OPTICAL CHARACTER GENERATOR FOR AN ELECTROGRAPHIC PRINTER

BACKGROUND OF THE INVENTION

1. Field of the Invention

The invention relates to an optical character generator for an electrographic printer having a plurality of monolithic circuits which are arranged on a carrier, each monolithic circuit comprising LEDs which are integrated therein and can be driven individually, and a drive circuit which is assigned to the character generator.

2. Description of the Related Art

Such an optical character generator is disclosed in European Patent Document EP-A2-0 180 479.

LED array character generators such as those which are also described, for example, in European Patent Document EP-B1-0 403 476 are used in non-mechanical printers for point-by-point discharging of electrostatic charged photoconductors. The latent electrostatic image produced in this way is inked in with the aid of a developer station and is transfer-printed onto the recording medium in a transfer-printing station. LED array character generators, which are supplied with drive signals via a drive circuit and a BUS circuit, are used to produce the charge image. Both the drive circuit and the BUS circuit are normally designed as separate integrated circuits. The ICs are constructed on the basis of monocrystalline silicon and contain a large number of transistors for analog/digital conversion (a switch function) and for amplification of currents (a driver function), which are required for the supply of the LED arrays.

As a rule, the LED arrays comprise 8, 16, 32, 64 or 128 light-emitting diodes which are arranged in series in a row (also termed the x-direction) and are integrated in one or more rows on individual monolithic circuits. A plurality of monolithic circuits which are joined to one another form the character generator. The structuring of the diodes is carried out on the basis of gallium arsenide. Each diode contains a connection pad via whose connection a current is passed and the diode is thus energized to illuminate. The light energy for exposure of the photoconductor is controlled via the magnitude of the current and via the time over which the diode is energized. Each individual LED is to this end connected to in each case one amplifier output of an IC. For this purpose, each IC is positioned very close to the LED arrays, so that a connection pad of an amplifier output of the IC is opposite each connection pad of an LED array. The pads are now connected to one another with the aid of automatic bonding machines. Since each character generator requires up to 11,000 diodes, and thus a correspondingly high number of bonded joints, depending on the length and the diode separation, separation into an LED chip and an IC and the connection technology which would have to be used for this purpose are not only very time-consuming but, furthermore, are also highly susceptible to defects. For example, a 300 dpi character generator has a distance of 85 $\mu$m between centers of the light-emitting diodes. The width of a connection pad can therefore be no greater than 60 $\mu$m if a safety margin of 25 $\mu$m is intended to remain between each pad. The positioning accuracy of each automatic bonding machine must therefore be so great over the length of the entire character generator of, for example, 300,000 $\mu$m to 500,000 $\mu$m that the first connection pad at the start of the bonding process and the last connection pad after 3000 to 6000 stepping movements as well lie in a reliable bonding area of approximately ±25 $\mu$m.

Various options are used in order to reduce the difficulties which occur during bonding. The connection pads are arranged offset in the y-direction so that they can be designed to be broader and the tolerance band for the bonding can thus be enlarged. However, this necessitates a greater area requirement in the chip surface and thus increases the price of the chips.

Another option, which is described in German Patent Document DE-C2-37 04 984, comprises the LED arrays being driven from both sides with ICs. Although this results in the opportunity to double the connection pad width, it increases the area requirement for the LED array, however, and, in addition, requires twice the number of ICs.

A further disadvantage of such LED character generators is that testing of the combination of LED arrays and ICs is not possible until the complete character generator has been assembled and the bonding process has been carried out. Defects which occur cannot be confirmed until the character generator has been completely assembled, for which reason repair by replacement of the ICs is difficult and expensive.

The dissipation of heat during the printing operation and, above all, the associated dissipation of the heat produced in the LED chips (which are monolithic circuits) to the carrier are problematic in all LED character generators. As a result of the small area of binding in the LED array, only a shrinkage-free solder joint is in general possible, as a result of which it is possible to dissipate heat in the z-direction to the cooling ribs which are possibly fitted there. A more favorable bonded joint, which is less problematic, by means of, for example, silver conductive adhesive, requires a large-area contact surface.

LED arrays having adequate radiation performance can at the moment be structured only on the basis of gallium arsenide substrates. The known silicon technology, which enables a high integration density of logic and analog structures, is once again generally used for the production of the drive circuits and of the BUS circuits. For this reason, until now, the LED chips and the ICs of the drive circuits and of the BUS circuits have had to be arranged in the described manner separately on the carrier of the character generator and have had to be linked to one another by means of a bonding technique.

European Patent Document EP-A1-0 199 852 discloses an optical character generator for an electrographic printer which comprises a monolithically integrated photodiode drive combination in the case of which both the associated LEDs and the drive circuit for the LEDs are integrated on a gallium arsenide substrate.

If optical character generators are composed of monolithic circuits having individual LED arrays, the light spot sequence with a predetermined light spot separation at the boundaries of the monolithic circuits must not be disturbed. This is particularly problematic in the case of a multi-row arrangement of the LEDs. In order to ensure this light spot sequence, European Patent Document EP-B1-0 403 476, which has already been discussed, discloses the individual monolithic circuits being separated by means of an oblique cut, and the monolithic circuits being joined to one another with a butt joint, taking account of the light spot sequence.

This necessitates a high adjustment cost during assembly, and furthermore causes material losses when the monolithic circuits are cut out of the wafer, and reduces the integration density of the LEDs.

SUMMARY OF THE INVENTION

An object of the invention is to provide an optical character generator, which can be produced easily and with low loss, for electrographic printers having a high integration density, which is composed of monolithic circuits which are fitted with individual LED arrays, and in the case of which the light spot sequence is reliably ensured in the edge region of the monolithic circuits.

This and other objects and advantages of the invention are achieved, in the case of an optical character generator of the type mentioned initially, by an optical character generator having a plurality of monolithic circuits which are arranged on a carrier, each monolithic circuit comprising LEDs which are integrated therein and can be driven individually, and a drive circuit which is assigned to the character generator for the LEDs, the LEDs having a covering layer with an associated light outlet opening which is assigned to light spots, and the light outlet openings being arranged offset with respect to one another in one row or in a plurality of rows corresponding to a predetermined grid, a partial light outlet opening is in each case constructed on the opposite edges of adjacent monolithic circuits such that a common light spot is formed by jointly driving these partial light outlet openings, which light spot extends over the area between the adjacent monolithic circuits.

Advantageous embodiments provide that the monolithic circuits comprise a monolithically integrated photodiode drive combination, in the case of which both the associated LEDs and the drive circuit for the LEDs are integrated in a monolithic circuit. The LEDs and the drive circuit are preferably constructed from the same semiconductor material. This semiconductor material preferably comprises III-V semiconductor material and the monolithic circuit or monolithic circuits is or are constructed on a carrier substrate made of III-V semiconductor material. In one embodiment, gallium arsenide is the semiconductor material.

The optical character generator preferably has a BUS drive arrangement for supplying drive data to the drive circuit, which is arranged in an integrated manner in the monolithic circuits. The monolithic circuits are arranged side by side on the carrier and have connecting contacts for the BUS drive arrangement in such a manner that the connecting contacts of the individual monolithic circuits are arranged opposite one another, it being possible to couple the BUS drive arrangements of adjacent monolithic circuits via these connecting contacts.

With respect to the arrangement of the drive circuit and/or of the BUS drive arrangement, the monolithic circuit or the monolithic circuits is or are constructed symmetrically with respect to one or more LED rows which is or are arranged centrally on the monolithic circuits.

Preferably, the monolithic circuits are connected to the carrier via a thermally conductive bonded joint. Specifically, the bonded joint is a silver conductive bonded joint.

As a result of the fact that partial light outlet openings are constructed on the adjacent monolithic circuits in the region of a light spot, which extends over the edge of the monolithic circuits, of the character generator, in such a manner that the partial light outlet openings form a common light spot, the monolithic circuits can be joined to one another without a butt joint and thus without any loss of material. The assembly cost is low. The light spot sequence is also ensured in the edge region of the monolithic circuits.

In the case of one advantageous embodiment, the monolithic circuits comprise a monolithically integrated photodiode drive combination, which is constructed from III-V semiconductor material, preferably gallium arsenide, and in the case of which both the associated LEDs and the drive circuit f or the LEDs are integrated in a monolithic circuit. As a consequence, a high integration density is possible.

A monolithic circuit in the form of a chip which is cut out of a substrate in this case contains both the light-emitting diodes and their associated drive circuit, including the BUS circuit for supplying the drive data.

Such a chip can be constructed, using thin-film technology, film layer by film layers on a gallium arsenide substrate, with the light windows, which define the light spots of the character generator, being closed off in accordance with the desired configuration. This construction, in conjunction with the structuring of the drive circuit, offers the most versatile variation options in the arrangement of the light windows. Testing of any such monolithic circuits of integrated construction can always be carried out before the assembly of the character generator and, as a consequence, reduces the costs for the previously normal additional cost resulting from costly necessary repairs in the final testing.

The high integration density of the monolithic circuits also makes it possible to use thermally conductive bonded joints during assembly, which ensures good heat dissipation during the printing operation. This extends the life of the character generators and, in addition, makes it possible to reduce the physical size with increased physical accuracy.

BRIEF DESCRIPTION OF THE DRAWINGS

Embodiments of the invention are described in more detail in the following text by way of example, and are illustrated in the drawings, in which.

DETAILED DESCRIPTION OF THE PREFERRED EMBODIMENT

An optical character generator, which is illustrated in the figures, f or an electrographic printer contains a large number of monolithic circuits 11 which are arranged side by side on a carrier 10, are constructed as integrated circuits and, depending on the embodiment, have LEDs 12 arranged in one or more rows and the associated drive and BUS circuits 13 and 14, respectively for the LEDs 12.

Figure 8:
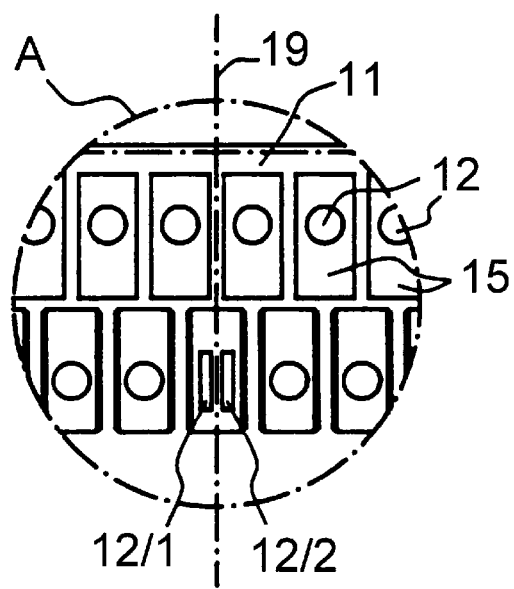
FIG. 8 shows an enlarged illustration of a detail from the arrangement of the LEDs in accordance with FIG. 7 on the separating line between two adjacent monolithic circuits.

The monolithic circuits 11 are produced using thin-film structuring technology from III-V semiconductor material, using a method such as that which is described, for example, in DE-C2-37 26 235. To this end, the structures of the drive circuit 13, which is designed as desired, for the LEDs and the LEDs 12 themselves are constructed film layer by film layer on a substrate made of III-V semiconductor material, preferably gallium arsenide (GaAs) material. The LEDs 12 themselves are covered by a covering layer 15 (FIG. 8) with light outlet openings 12 constructed thereon. These light outlet openings 12 define light spots for point by point charging or discharging of the photoconductor drum of the electrographic printer, and they are arranged along one row on the monolithic circuits 11, in a predetermined grid size. The light spots 12 are normally focused by means of a focusing device, which is not illustrated here, in the form, for example, of a Selfoc (self focusing) device.

The film construction can be carried out simultaneously for a plurality of monolithic circuits 11 on one wafer. After this, the monolithic circuits 11 are cut out of the wafer in accordance with the desired size, and are functionally tested in a suitable testing device. After testing, they are installed in the character generator, for example with the aid of an automatic placement machine, the individual monolithic circuits 11 being bonded, on a highly accurately prepared surface of a metal carrier 10 with the aid of silver conductive adhesive and, possibly, being connected to supply lines via their connections 16 (bonding pads).

With regard to the embodiments in detail:

FIG. 1

Figure 1:
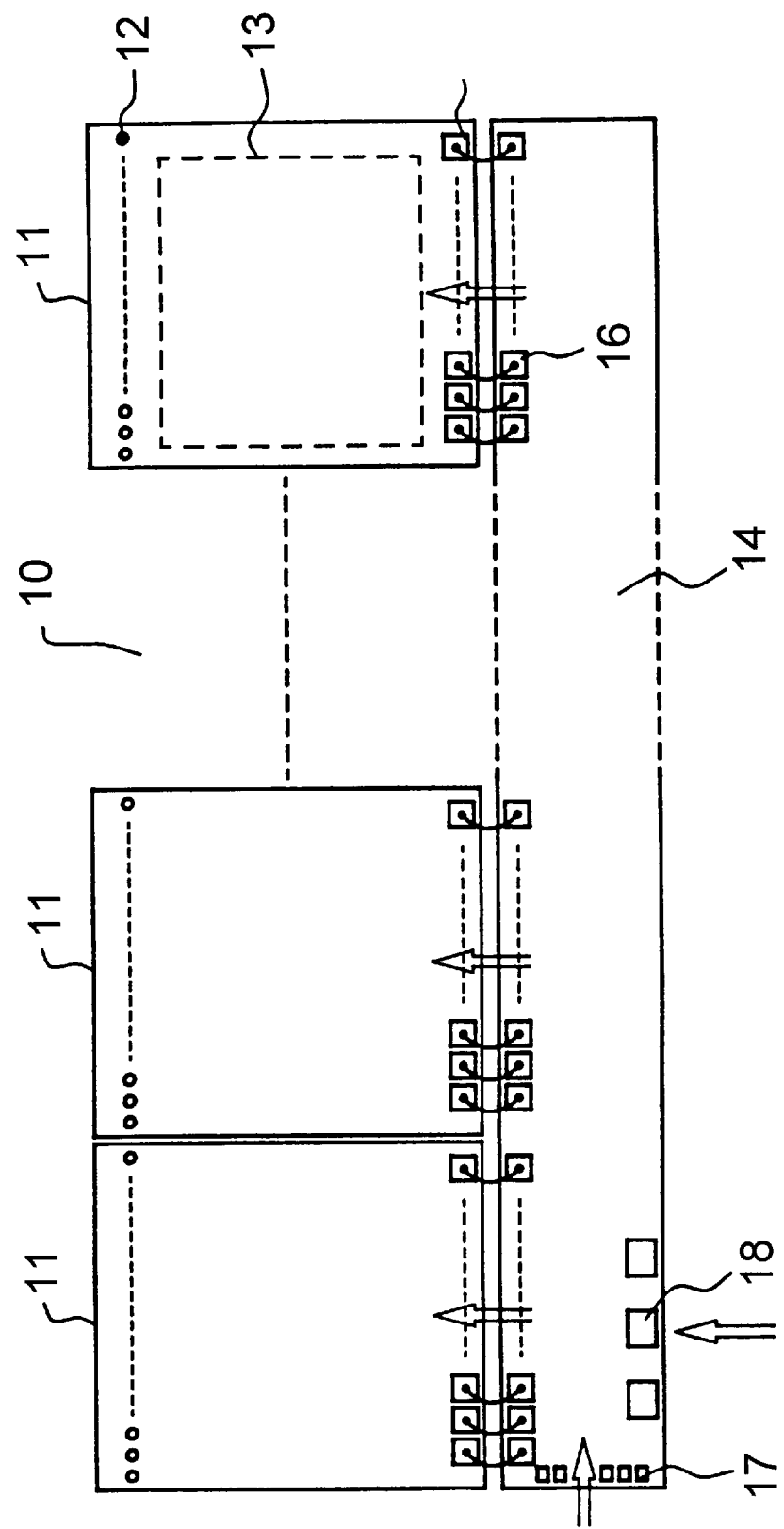
FIG. 1 shows a schematic illustration of a plan view of an LED character generator which is constructed from individual monolithic circuits having a drive circuit, which is integrated therein, for the LEDs, the LEDs being arranged in one row. The monolithic circuits are coupled to a separate BUS drive circuit.

In the case of the embodiment of the character generator according to FIG. 1, the drive circuit 13 for the LEDs 12 is also integrated in the monolithic circuits 11, the LEDs 12 being arranged in the form of a single row of LEDs. All the monolithic circuits 11 or chips are mounted side by side on the carrier 10, so that a continuous LED row is formed, of LEDs 12 which can be excited individually. The LEDs 12 are in this case arranged in the region of a front edge of the monolithic circuits 11 and are driven via the drive circuit 13 which is integrated in the monolithic circuit 11. A separate BUS drive arrangement, which supplies the drive circuit 13 with drive data, is connected to all the monolithic circuits 11 via bonding pads 16. In the case of the illustrated exemplary embodiment, the BUS circuit 14 comprises a separate integrated circuit which can be connected via data pads 17 to the equipment controller. Furthermore, the BUS circuit 14 has power supply pads 18. The arrows show the supply direction of the data into and out of the BUS 14, as well as the supply direction of the current of the power supply.

This configuration results in bonding now being necessary only between the monolithic circuits 11 and the BUS 14, via the bonding pads 16.

If a defect occurs during operation in one of the monolithic circuits 11 of the character generator, or if faults occur in the BUS 14, then only the corresponding component of the character generator need be replaced. This is easily possible as a result of the reduced number of connections.

FIG. 2

Figure 2:
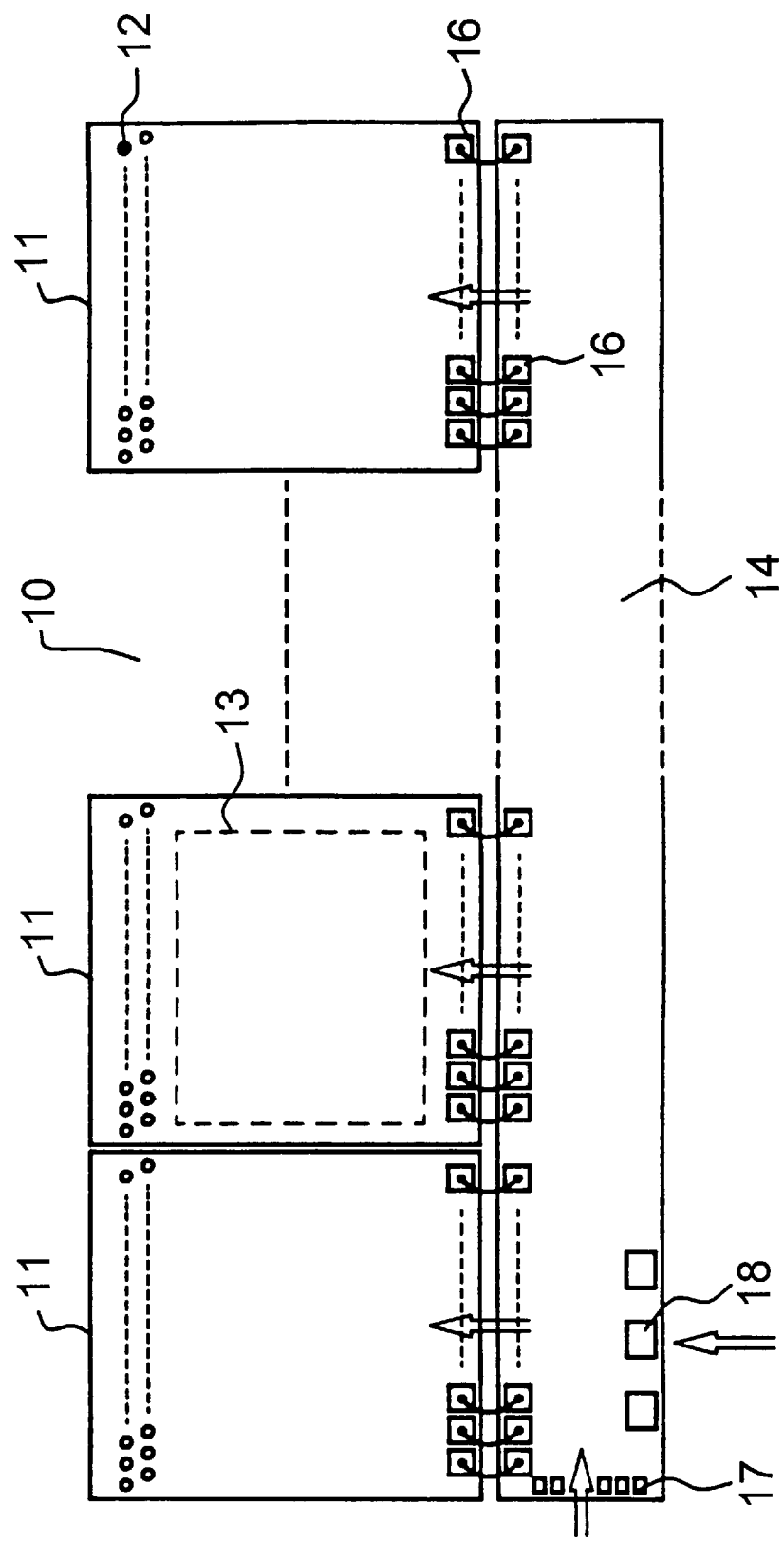
FIG. 2 shows a schematic illustration of a plan view of an LED character generator according to FIG. 1, in the case of which the LEDs are arranged in two rows.

A considerable improvement in the printed images results if, in accordance with the embodiment in FIG. 2, the LEDs 12 are arranged offset with respect to one another in two rows in such a manner that the illuminated spots overlap when the photoconductor is illuminated. The two-row arrangement results in the possibility of increasing the efficiency of the LED arrays by means of higher radiated power (per current unit) using enlarged light windows 12 and, in addition, of setting the desired amount of overlap of the light spots on the photoconductor.

Normally, such monolithic circuits having two-row LED strips are separated from the wafer by means of an oblique cut. However, such an oblique cut can be avoided if, in accordance with the illustration in FIG. 8, a light window which occurs in the region of a chip separating line 19 is designed such that it has two partial light outlet openings 12/1 and 12/2, between which the chip separating line 19 runs. The two partial light outlet openings 12/1 and 12/2 are each assigned to adjacent monolithic circuits 11 when the character generator is in the assembled state, and thus form a common light spot when excited jointly. The separating line 19 running in between has no disturbing effect since the grid size is governed only by the centroid of the light elements involved in the light spot. The different form of the partial light outlet openings 12/1 and 12/2 also has no negative effect on the resolution, since the downstream Selfoc (self focusing) device ensures appropriate focusing.

FIG. 3, FIG. 4

Figure 3:
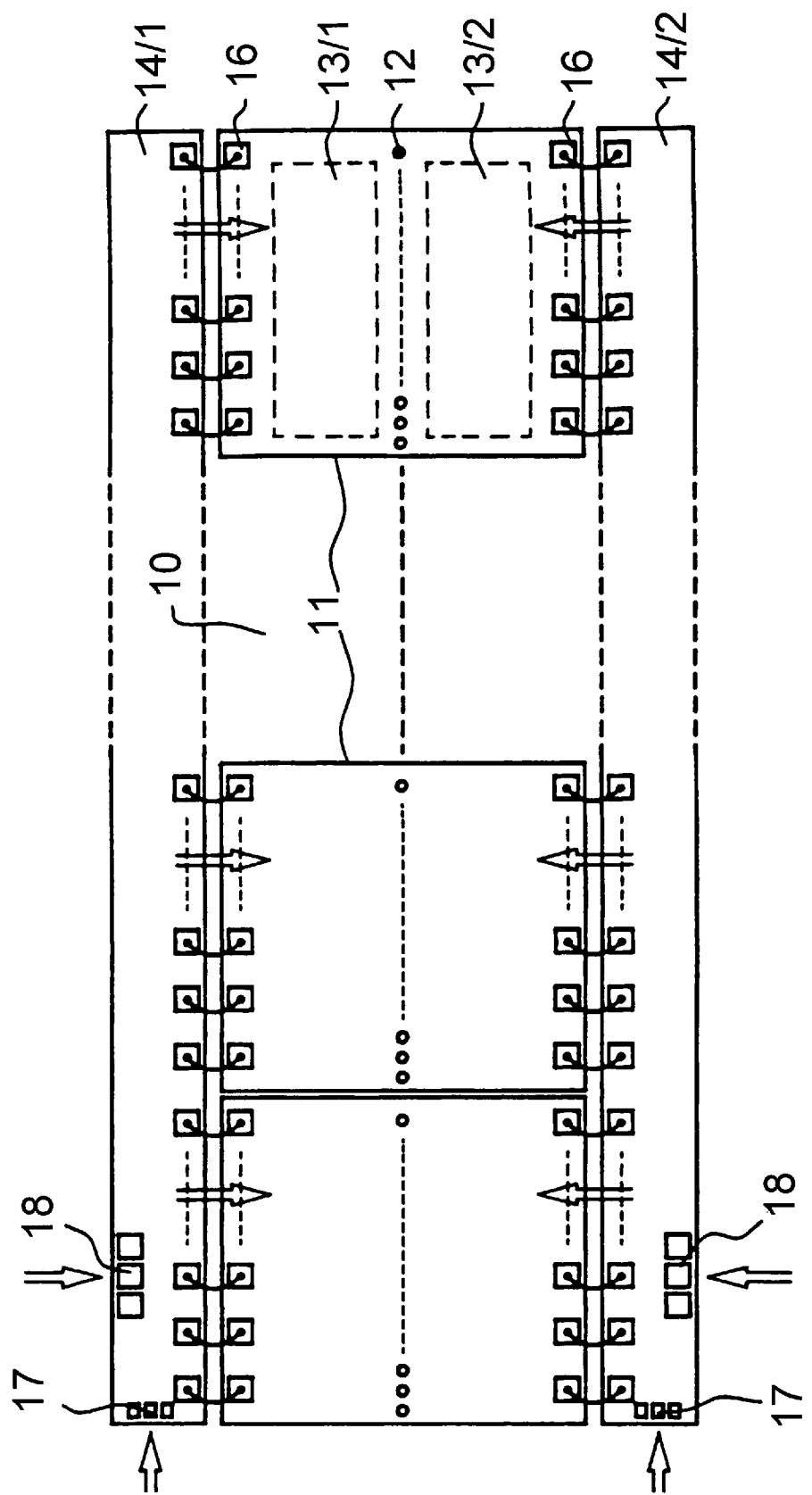
FIG. 3 shows a schematic illustration of a plan view of an LED character generator with the individual monolithic circuits being constructed symmetrically with respect to a centrally arranged, single-row LED strip, as well as BUS drive arrangements which are arranged on both sides of the monolithic circuits.
Figure 4:
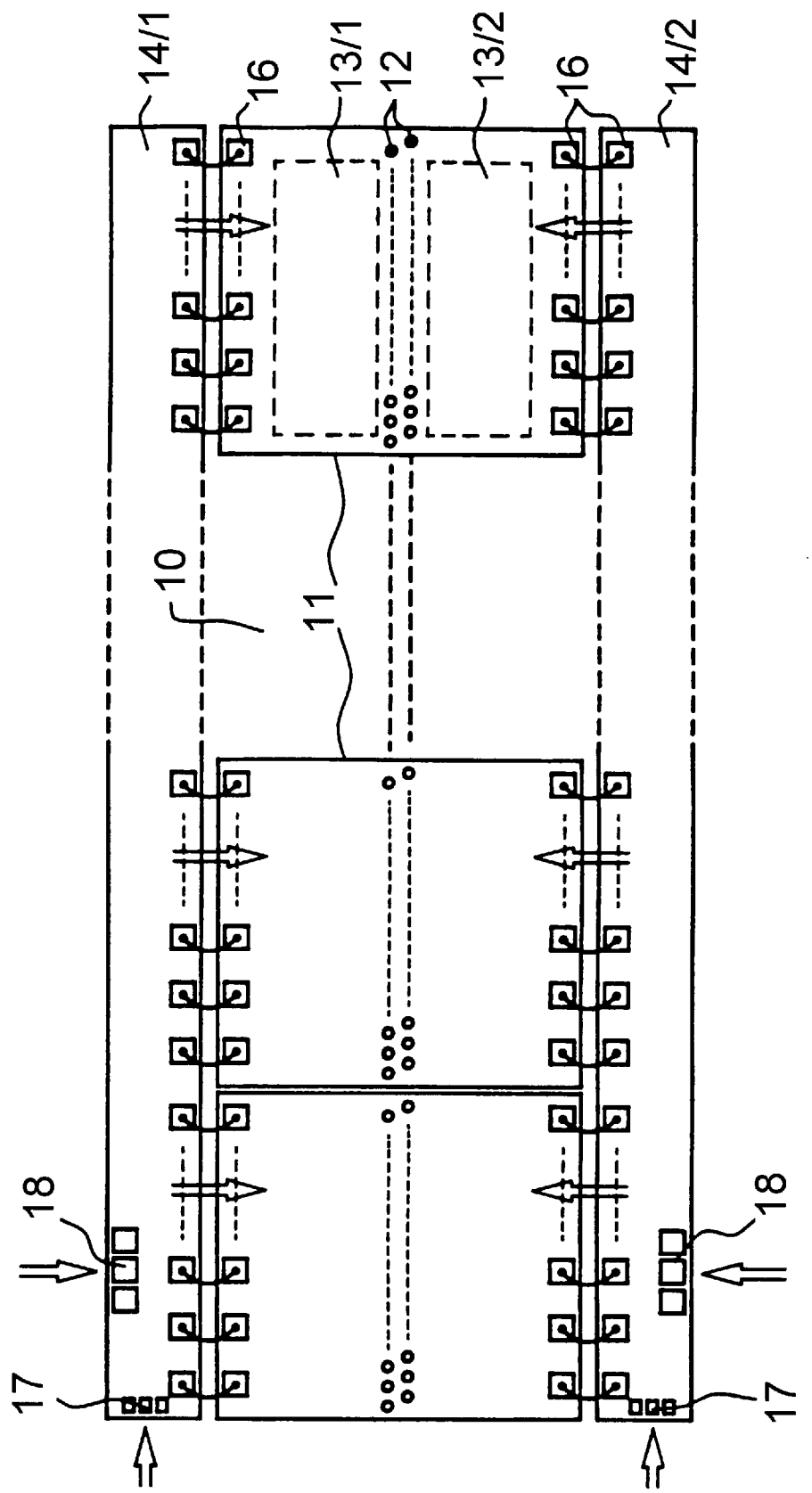
FIG. 4 shows a schematic illustration of a plan view of an LED character generator in accordance with FIG. 3, in the case of which the LEDs are arranged offset with respect to one another in two rows.

If the distance of the light windows 12 from one another becomes very small as the resolution becomes better and better, then the possibility arises of the LED row being arranged centrally on the monolithic circuit 11 and both the supply currents and the bit data being supplied on both sides. In the exemplary embodiments according to FIGS. 3 and 4, this symmetrical arrangement is illustrated both for one LED row and for a two-row arrangement. The monolithic circuits 11 with their associated integrated drive circuits 13 are in this case supplied with data via two separate BUS circuits 14. The drive circuit 13 in the monolithic circuit can in this case be designed as separate drive circuits 13/1 and 13/2 which each drive groups of LEDs of the monolithic circuit 11. For example, the first, third, fifth, etc. LEDs in the row can be driven via the drive circuit 13/1, and the second, fourth, sixth, etc. via the drive circuit 13/2, or else, in the case of a two-row LED arrangement, the drive circuit 13/1 can drive one row and the drive circuit 13/2 can drive the other row of LEDs.

FIG. 5, FIG. 6

Figure 5:
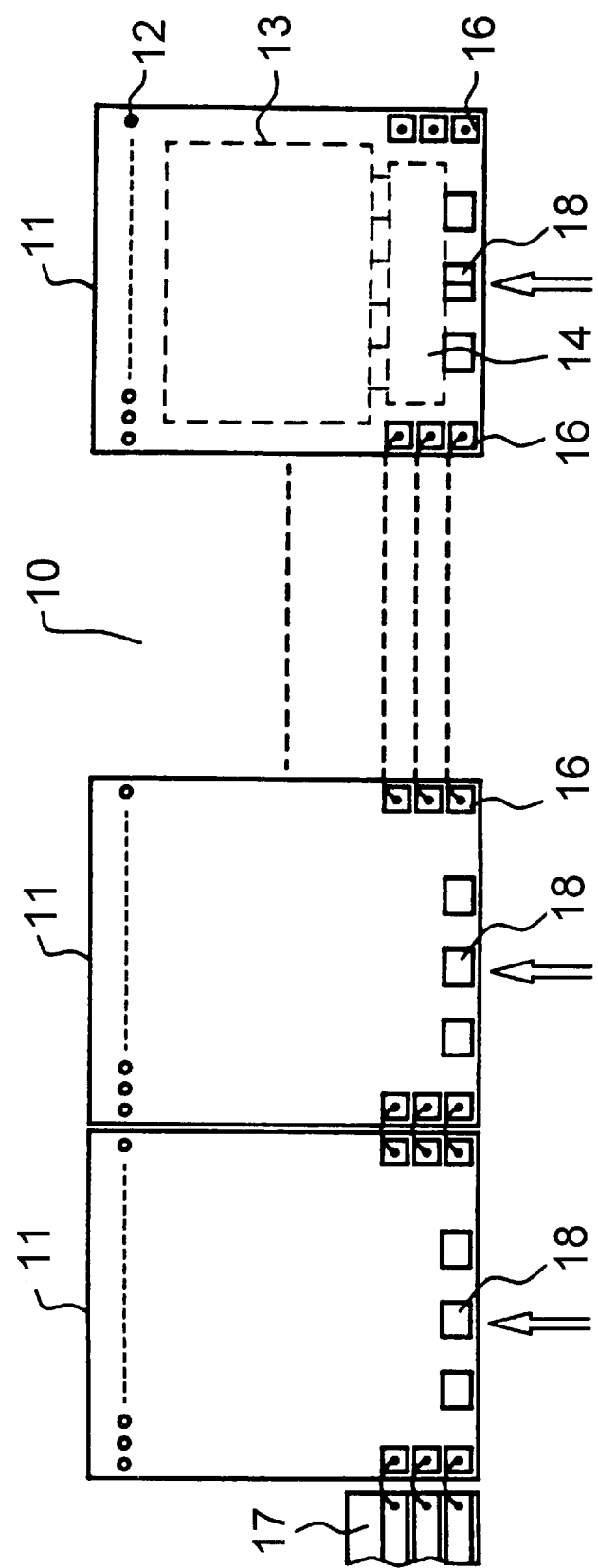
FIG. 5 shows a schematic illustration of a plan view of an LED character generator composed of individual monolithic circuits with a drive and BUS circuit, which is integrated therein, for the LEDs, the LEDs being arranged in one row.
Figure 6:
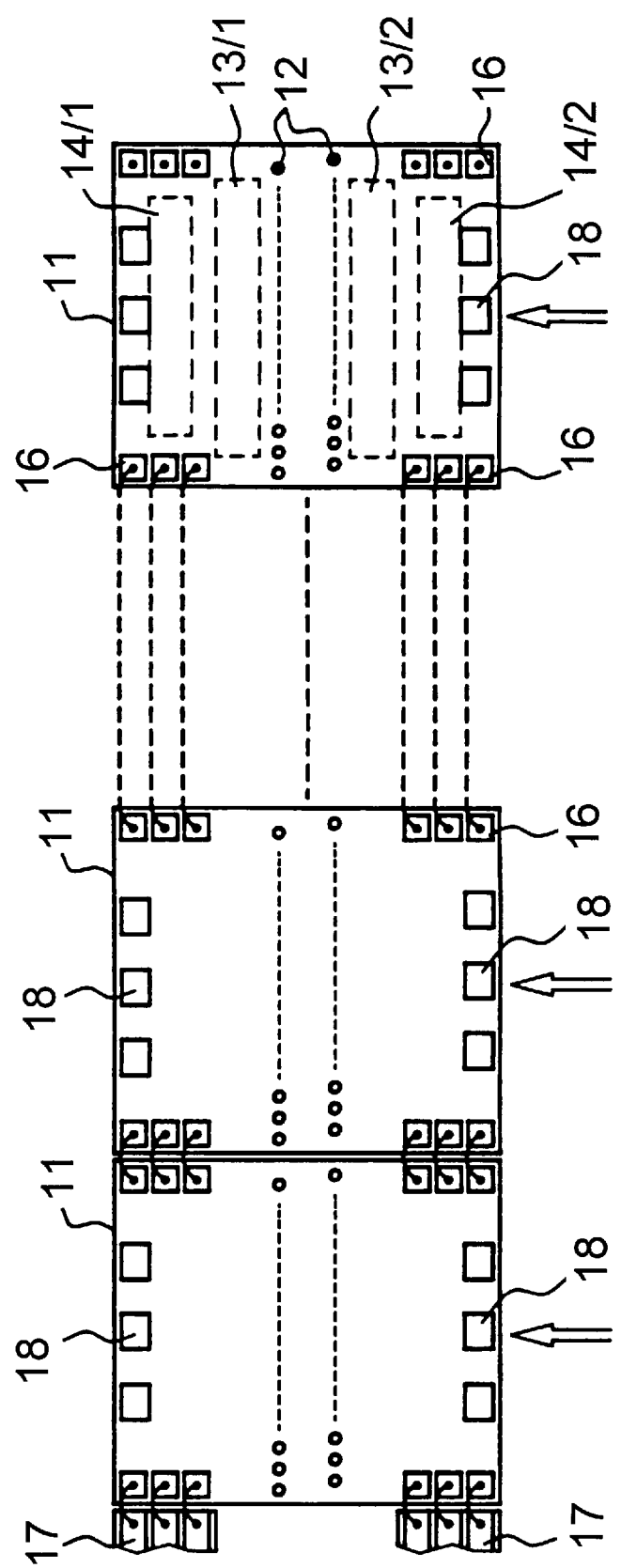
FIG. 6 shows a schematic illustration of a plan view of an LED character generator composed of individual symmetrically constructed monolithic circuits with a drive and BUS circuit, which is integrated therein, the LEDs being arranged offset with respect to one another in two rows.
Figure 7:
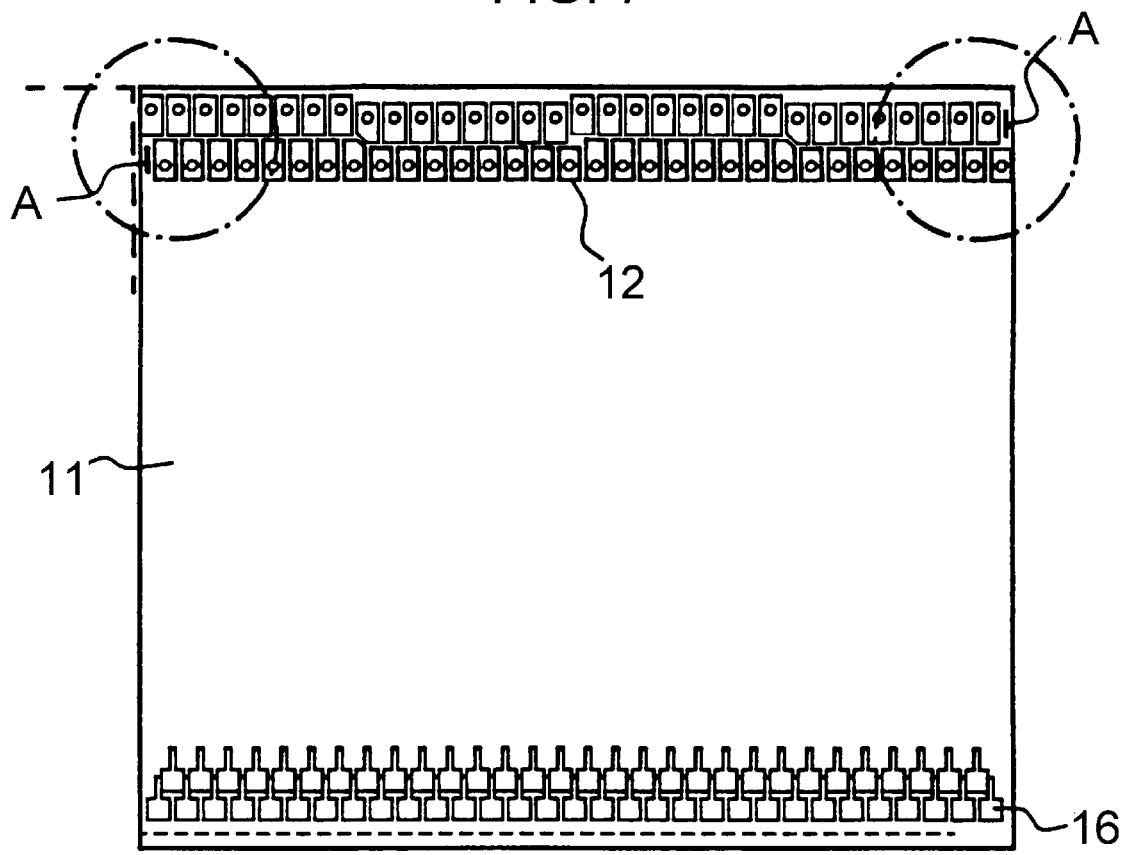
FIG. 7 shows a schematic illustration of a plan view of an individual monolithic circuit with an integrated drive circuit for the LEDs, which are arranged offset with respect to one another in a plurality of rows.

If, in accordance with the exemplary embodiments in FIGS. 5 and 6, the BUS circuit 14 is additionally integrated in the monolithic circuits 11, this means an increase in integration. In this case, the BONDING pads 16 of the monolithic circuits 11 are expediently arranged such that adjacent bonding pads of the monolithic circuits 11 are opposite one another. In the case of such an integration of the BUS circuit 14 in the monolithic circuits 11, additional shift registers should be integrated within the monolithic circuits, which registers pass the bit data on, with their addresses, from monolithic circuit to monolithic circuit, at sufficiently high clock frequencies. In the case of a centrally symmetrical LED arrangement according to FIG. 6, the BUS circuit and drive circuit are arranged in an integrated manner on both sides of the two-row LED strip and, in addition, shift registers are constructed which activate the integrated circuits on both sides, for the upper and lower LED row respectively. Electrical power is likewise supplied on both sides, via the power supply pads 18.

On page 12, after line 16, add the following new Although other modifications and changes may be suggested by those skilled in the art, it is the intention of the inventors to embody within the patent warranted hereon all changes and modifications as reasonably and properly come within the scope of their contribution to the art.

We claim:

1. An optical character generator for an electrographic printer, comprising:

a carrier;

plurality of monolithic circuits arranged on said carrier, each of said monolithic circuits including:

light emitting diodes are integrated in said monolithic circuits and connected so as to be driven individually, and a drive circuit connected to drive each of said light emitting diodes individually, said drive circuit connected to jointly drive ones of said light emitting diodes at edges of adjacent ones of said monolithic circuits, a covering layer with light outlet openings over said light emitting diodes to produce light spots, and said light outlet openings being arranged offset with respect to one another in at least one row, partial light outlet openings on opposite edges of adjacent ones of said plurality of monolithic circuits, said partial light outlet openings of adjacent monolithic circuits being disposed adjacent one another such that a common light spot is formed by jointly driving ones of said light emitting diodes under said partial light outlet openings, a separating line between adjacent ones of said monolithic circuits running between said partial light outlet openings.

2. An optical character generator as claimed in claim 1, wherein said monolithic circuits comprise a monolithically integrated photodiode drive combination, in the case of which both associated ones of said LEDs and the drive circuit for the LEDs are integrated in a monolithic circuit.

3. An optical character generator as claimed in claim 1, wherein said LEDs are of a semiconductor material and the drive circuit is of said semiconductor material.

4. An optical character generator as claimed in claim 3, wherein said semiconductor material comprises III-V semiconductor material and said monolithic circuit is constructed on a carrier substrate made of III-V semiconductor material.

5. An optical character generator as claimed in claim 3, wherein gallium arsenide is the semiconductor material.

6. An optical character generator as claimed in claim 1, further comprising:

a BUS drive arrangement for supplying drive data to the drive circuit, which is arranged in an integrated manner in the monolithic circuits.

7. An optical character generator as claimed in claim 6, wherein said monolithic circuits are arranged side by side on the carrier and further comprising:

connecting contacts for the BUS drive arrangement being disposed so that the connecting contacts of the individual monolithic circuits are opposite one another, said connecting contacts of the BUS drive arrangements of adjacent monolithic circuits being coupled together so that adjacent monolithic circuits are connected to one another.

8. An optical character generator as claimed in claim 1, wherein, with respect to arrangement of the drive circuit, the monolithic circuit is constructed symmetrically with respect to at least one LED row which is arranged centrally on the monolithic circuits.

9. An optical character generator as claimed in claim 1, further comprising:

a thermally conductive bonded joint connecting said monolithic circuits to said carrier.

10. An optical character generator as claimed in claim 9, wherein said bonded joint is a silver conductive bonded joint.

* * * * *